United States Patent
Lin et al.

(10) Patent No.: US 9,594,123 B2
(45) Date of Patent: Mar. 14, 2017

(54) TECHNIQUES FOR ESTIMATING BATTERY PACK PARAMETERS

(71) Applicants: Jian Lin, Beverly Hills, MI (US); Hong Yang, Rochester Hills, MI (US); Steven L Clark, Birmingham, MI (US)

(72) Inventors: Jian Lin, Beverly Hills, MI (US); Hong Yang, Rochester Hills, MI (US); Steven L Clark, Birmingham, MI (US)

(73) Assignee: FCA US LLC, Auburn Hills, MI (US)

( * ) Notice: Subject to any disclaimer, the term of this patent is extended or adjusted under 35 U.S.C. 154(b) by 895 days.

(21) Appl. No.: 13/917,142

(22) Filed: Jun. 13, 2013

(65) Prior Publication Data

US 2014/0372053 A1    Dec. 18, 2014

(51) Int. Cl.
*G01R 31/36* (2006.01)
*B60L 11/18* (2006.01)

(52) U.S. Cl.
CPC ...... *G01R 31/3648* (2013.01); *B60L 11/1851* (2013.01); *G01R 31/3658* (2013.01)

(58) Field of Classification Search
CPC ............ G01R 31/3648; G01R 31/3658; G01R 31/3606; G01R 31/3624; G01R 31/3662; G01R 31/3675; G01R 31/3679; G01N 27/416; B60L 11/1851; B60L 11/1857; B60L 11/1861–11/1862; B60L 11/1864; B60L 11/1866; B60L 11/187; B60L 11/1879
See application file for complete search history.

(56) References Cited

U.S. PATENT DOCUMENTS

| | | | |
|---|---|---|---|
| 7,518,375 B2 | 4/2009 | Kim et al. | |
| 2011/0049977 A1* | 3/2011 | Onnerud | B60L 3/0046 307/9.1 |
| 2012/0136594 A1* | 5/2012 | Tang | G01R 31/3679 702/63 |
| 2012/0306504 A1 | 12/2012 | van Lammeren | |
| 2012/0310562 A1 | 12/2012 | van Lammeren et al. | |

* cited by examiner

*Primary Examiner* — Toan Le
(74) *Attorney, Agent, or Firm* — Ralph E. Smith (57) ABSTRACT

A method for a battery pack controller of an electrified vehicle, the battery pack controller including one or more processors, includes identifying N battery cells of a battery pack that includes M battery cells, the N battery cells being weakest battery cells of the battery pack, wherein N is an integer greater than zero and less than M. The method includes determining one or more first parameters for each of the N battery cells, each of the one or more first parameters indicating a parameter for a specific battery cell. The method includes estimating one or more second parameters for the battery pack based on the one or more first parameters for each of the N battery cells, each of the one or more second parameters indicating a parameter for the battery pack. The method also includes outputting the one or more second parameters for the battery pack.

17 Claims, 4 Drawing Sheets

TECHNIQUES FOR ESTIMATING BATTERY PACK PARAMETERS

FIELD

The present disclosure relates generally to techniques for estimating battery pack parameters and, more particularly, to techniques for power limit prediction for multi-cell battery systems in electrified vehicles.

BACKGROUND

An electrified vehicle (EV) refers to any vehicle that can be powered by an electric motor. More specifically, a battery pack of the EV can provide a current to the electric motor, which in turn can propel the EV. The battery pack can include a plurality of battery cells, such as lithium-ion (Li-ion) battery cells. One example of an EV is a hybrid EV (HEV). An HEV typically includes an internal combustion engine, which can be used to periodically recharge the battery pack and/or to periodically propel the vehicle, thereby extending a range of the vehicle. Another example of an EV is a battery electric vehicle (BEV). A BEV is a battery-only vehicle and thus does not include an internal combustion engine.

SUMMARY

In one form, a method is provided in accordance with the teachings of the present disclosure. The method can include identifying, at a battery pack controller of an electrified vehicle, the battery pack controller including one or more processors, N battery cells of a battery pack that includes M battery cells, the N battery cells being weakest battery cells of the battery pack, wherein N is an integer greater than zero and less than M. The method can include determining, at the battery pack controller, one or more first parameters for each of the N battery cells, each of the one or more first parameters indicating a parameter for a specific battery cell. The method can include estimating, at the battery pack controller, one or more second parameters for the battery pack based on the one or more first parameters for each of the N battery cells, each of the one or more second parameters indicating a parameter for the battery pack. The method can also include outputting, from the battery pack controller, the one or more second parameters for the battery pack.

In another form, a method is provided in accordance with the teachings of the present disclosure. The method can include measuring, at a battery pack controller of an electrified vehicle, the battery pack controller including one or more processors, a voltage at each battery cell of a battery pack comprising M cells to obtain M voltages. The method can include identifying, at the battery pack controller, a first subset of battery cells based on the M voltages, wherein the first subset of battery cells represents a low cell window (LCW) and includes any of the M battery cells having lowest voltages during discharging. The method can include identifying, at the battery pack controller, a second subset of battery cells based on the M voltages, wherein the second subset of battery cells represents a high cell window (HCW) and includes any of the M battery cells having highest voltages during charging, wherein a total number of battery cells in the first and second subsets of battery cells equals N, and wherein N is an integer greater than zero and less than M. The method can include determining, at the battery pack controller, a set of first parameters for each of the N battery cells in the LCW and the HCW, the set of first parameters including current and voltage at the specific battery cell. The method can include estimating, at the battery pack controller, a set of second parameters for the battery pack based on the set of first parameters for each of the N battery cells in the LCW and the HCW using an online recursive least square (RLS) algorithm, the set of second parameters including at least one of a state of power (SOP), a state of charge (SOC), and a state of health (SOH) for the battery pack. The method can also include outputting, from the battery pack controller, the set of second parameters for the battery pack.

Further areas of applicability of the teachings of the present disclosure will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present disclosure are intended to be within the scope of the present disclosure.

DESCRIPTION

As previously described, an electrified vehicle (EV) can include a battery pack that provides a current to an electric motor, which in turn can propel the EV. The battery pack can be periodically recharged via a variety of power sources. In a hybrid electric vehicle (HEV), for example, the battery pack can be recharged by a generator that is rotatably driven by an internal combustion engine. In a plug-in HEV (PHEV), for example, the battery pack can be recharged via wall outlet power. In a battery electric vehicle (BEV), the battery pack can be recharged when its state of charge (SOC) approaches zero. The SOC can refer to an amount of charge or energy remaining in the battery pack.

In addition to the SOC, there are other important parameters for the battery pack that require monitoring. These parameters can include state of power (SOP) and state of health (SOH). The SOP can refer to a power limit prediction for the battery pack. In other words, the SOP can represent a prediction of a maximum power output of the battery pack. The SOH, on the other hand, can represent a maximum capacity and an impedance growth of a battery pack containing a plurality of battery cells. Capacity can refer to a total amount of energy that can be stored in a particular battery cell, while impedance can refer to the opposition to the passage of an electric current through the particular battery cell.

Battery cells can age over time due to repeated discharging and recharging and/or due to aging over a calendar life. These parameters for the battery pack, therefore, can be calculated periodically throughout a lifetime of the battery pack. One technique for calculating the parameters for the battery pack includes using an average of parameters of all the battery cells. Some of the battery cells in a battery pack, however, may age differently. Uneven heat distribution, for example, can result in uneven aging of battery cells. In addition, manufacturing variations can also result in uneven aging of battery cells. This technique, therefore, can be inaccurate. Another technique for calculating these parameters for the battery pack includes calculating these parameters for each of the individual battery cells. This technique, however, can require extensive processor throughput, which can increase costs.

Accordingly, techniques are presented for estimating battery pack parameters including power limit prediction for protection of multi-cell battery packs for EVs. The techniques can provide for decreased processor throughput, which can decrease costs, while providing for acceptable accuracy. The techniques can be implemented at a battery pack controller including one or more processors or another suitable computing device including one or more processors that are configured to control the battery pack. The techniques can include identifying N weakest battery cells of the battery back, which can include M battery cells, where N is an integer greater than one and less than M. The techniques can then determine one or more first parameters (resistances, capacitances, open circuit voltages, etc.) for each of the N battery cells. The techniques can then estimate one or more second parameters (SOC, SOP, SOH, etc.) for the N weakest battery cells based on the one or more first parameters. For example, the techniques can utilize a recursive least square (RLS) algorithm to estimate the one or more second parameters for the N weakest battery cells.

The techniques can then determine one or more second parameters for the battery pack as a whole (SOC, SOP, SOH, etc.) based on the one or more second parameters for the N weakest battery cells. For example, the SOC of the battery pack can be determined as the smallest SOC of the N weakest battery cells. Additionally, for example, the SOP of the battery pack can be determined as the lowest SOP of the N weakest battery cells. Lastly, for example, the SOH of the battery pack can be determined as either the lowest capacity or highest impedance of the N weakest battery cells. The techniques can then output the one or more second parameters for the battery pack, e.g., to a memory of the battery pack controller and/or to a separate vehicle controller. For example, the estimated SOP can cause the vehicle controller to selectively regulate a driver torque request to an electric motor of the electrified vehicle, which can protect the battery pack from potential damage.

The techniques of the present disclosure may be particularly useful in their application to BEVs because BEVs are always utilizing the battery pack to power the electric motor for propulsion, whereas HEVs and other hybrid configurations may only use the battery pack/electric motor in specific situations, and therefore accurate monitoring of the battery pack parameters, e.g., the SOP, may be more critical for BEVs. Additionally, while the techniques of the present disclosure are described with specific reference to battery packs for EVs, it should be appreciated that the techniques of the present disclosure could be implemented in any suitable systems having multi-cell battery packs, e.g., consumer electronics.

Figure 1:
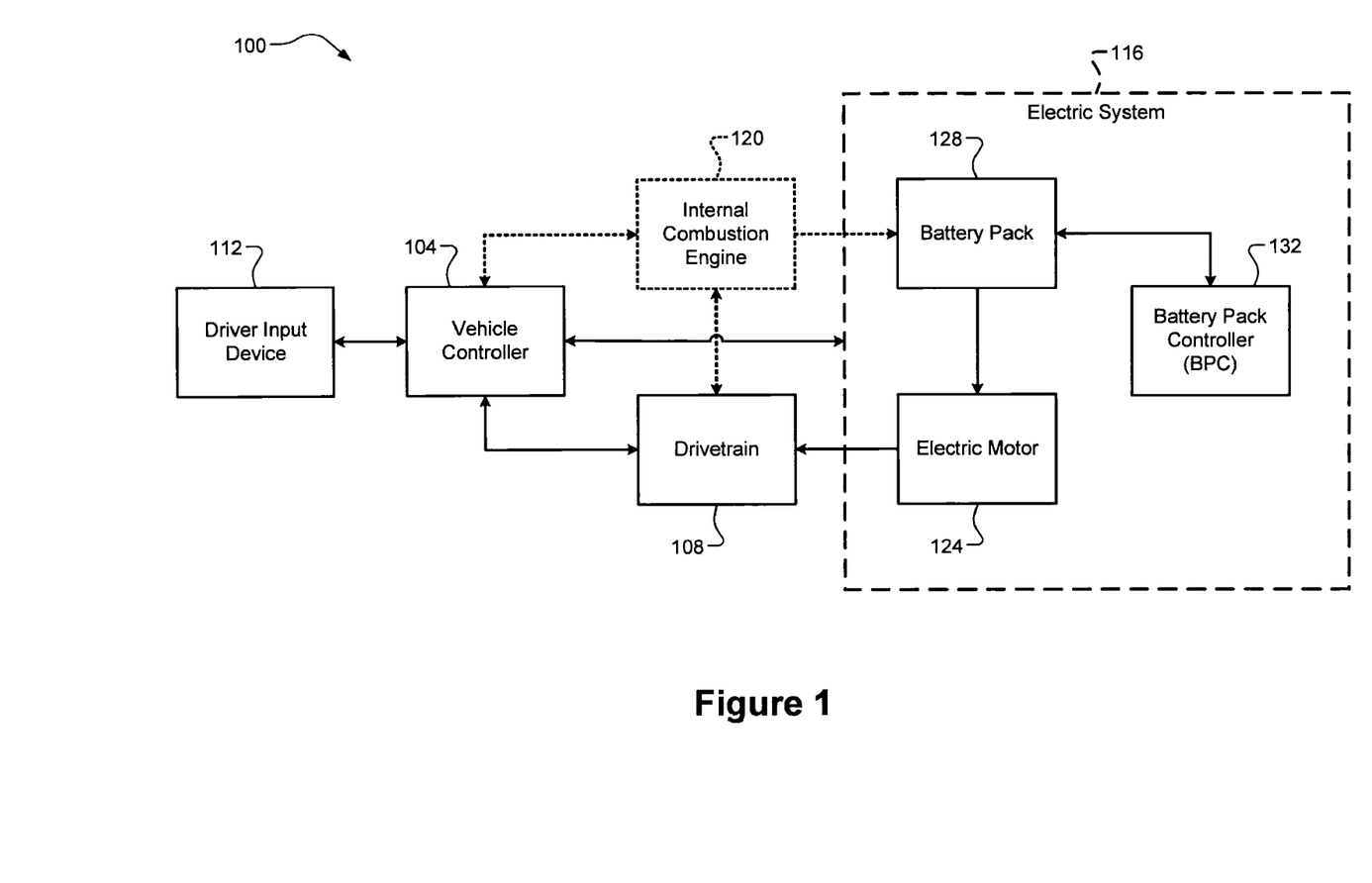
FIG. 1 is a functional block diagram of an electrified vehicle (EV) having an electric system including a battery pack controller (BPC) according to the principles of the present disclosure.

Referring now to FIG. 1, a functional block diagram of an electrified vehicle (EV) 100 is illustrated. The EV 100 can include a vehicle controller 104 that controls operation of the EV 100. Specifically, the vehicle controller 104 can control drive torque supplied to a drivetrain 108 in response to driver input via a driver input device 112. The drivetrain 108 can be any suitable vehicle drivetrain that can propel the vehicle using the drive torque, e.g., four wheels. The driver input device 112 can be any suitable device configured to allow a driver of the EV 100 to provide input relative to the torque request, e.g., an accelerator pedal.

The drive torque can be supplied to the drivetrain 108 from an electric system 116. The EV 100 can optionally include an internal combustion engine 120, e.g., an HEV configuration. In some implementations, the drive torque may also be supplied periodically from the internal combustion engine 120. The internal combustion engine 120 can draw in air, which can be mixed with fuel and combusted within cylinders to rotatably drive a crankshaft and generate drive torque. In some implementations, the internal combustion engine 120 can rotatably drive a generator (not shown), and the generator can be utilized to recharge a portion of the electric system 116.

The electric system 116 can include an electric motor 124, a battery pack 128, and a battery pack controller (BPC) 132. The electric motor 124 can be rotatably driven to generate the drive torque supplied to the drivetrain 108. The battery pack 128 can supply a current to rotatably drive the electric motor 124. The battery pack 128 can be recharged via wall outlet power, e.g., a PHEV or BEV configuration, and/or via the optional internal combustion engine 120 as described above. The BPC 132 can control operation of the battery pack 128 and can estimate its operating capability.

Figure 2:
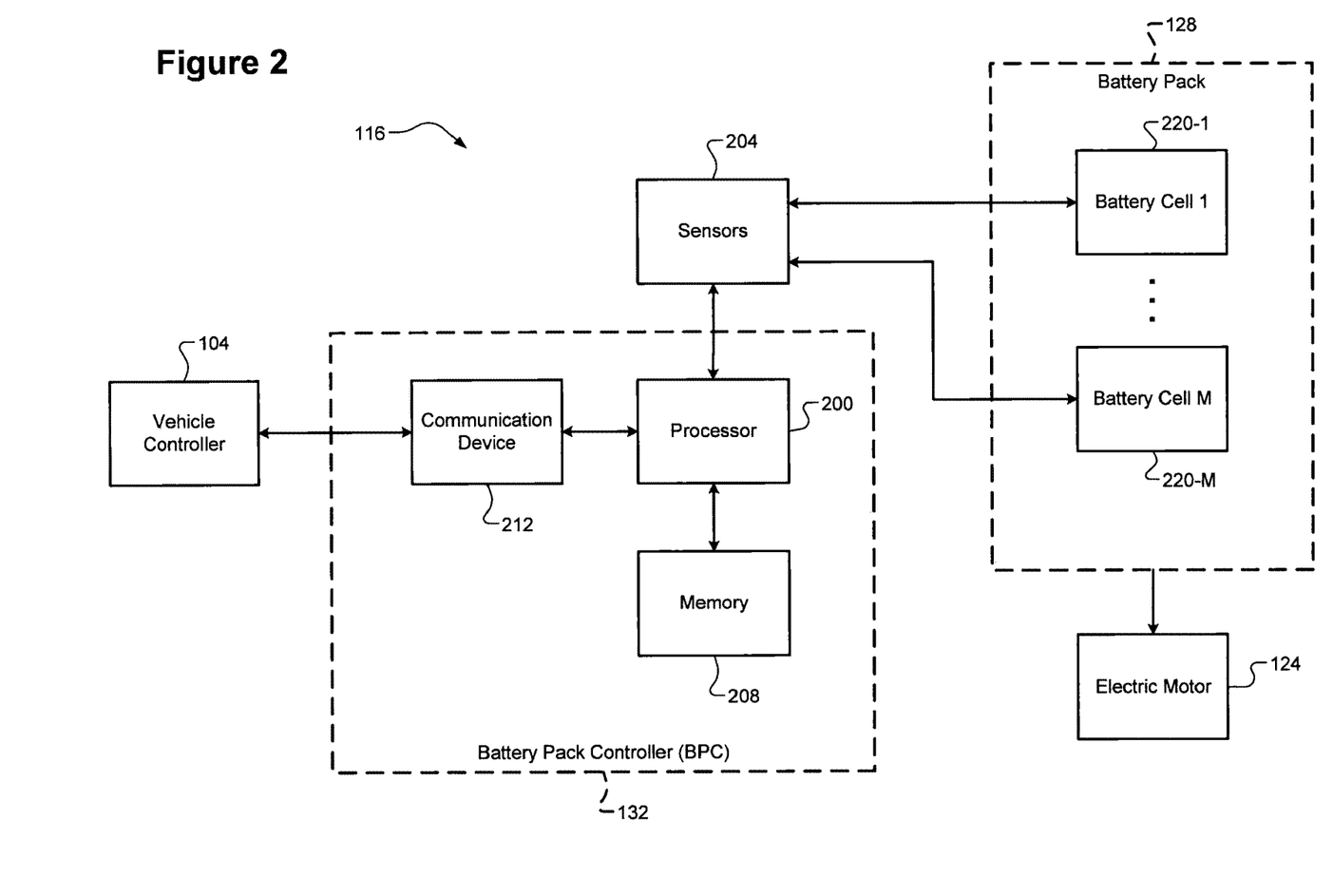
FIG. 2 is a functional block diagram of the electric system of FIG. 1 including the BPC according to the principles of the present disclosure.

Referring now to FIG. 2, a functional block diagram of the BPC 132 is illustrated. The BPC 132 can include a processor 200 and a memory 208. It should be appreciated that the BPC 132 can include other suitable components, such as a communication device 212 configured for communication with other components of the EV 100, e.g., the vehicle controller 104, via a controller area network (CAN) or another suitable network. The BPC 132 can also interact with one or more sensors 204 (hereinafter "sensors 204"). While the sensors 204 are shown as separate standalone sensors, it should be appreciated that the sensors 204 can be implemented as part of the BPC 132 or as part of the battery pack 128.

It should be appreciated that the term "processor" as used herein can refer to both a single processor and two or more processors operating in a parallel or distributed architecture. The processor 200 can control operation of the BPC 132. Specifically, the processor 200 can control functions including, but not limited to loading/executing an operating system of the BPC 132, controlling communication between the BPC 132 and other components, e.g., the vehicle controller 104, via the communication device 212, processing information from the sensors 204, and/or controlling read/write operations at the memory 208. The memory 208 can be any suitable storage medium (flash, hard disk, etc.). In some implementations, the memory 208 can be non-volatile memory (NVM). The communication device 212 can include any suitable communication components, e.g., a transceiver, which can be configured for communication with other components of the EV 100, such as the vehicle controller 104.

The battery pack 128 can include a plurality of battery cells 220-1 . . . 220-M (hereinafter "battery cells 220," M being an integer greater than 1). The battery cells 220 can be configured in series, in parallel, or a combination thereof. The sensors 204 can monitor one or more measured parameters (voltages, currents, temperatures, etc.) of the battery cells 220. These one or more measured parameters can also be referred to as one or more first parameters or a set of first parameters. These one or more measured parameters can be used for calculating one or more first parameters (or a set of first parameters) for the battery pack 128 as a whole. In some implementations, the battery cells 220 can also be divided into two or more groups, each of which can be monitored individually.

The processor 200 can also wholly or partially execute the techniques according to some implementations of the present disclosure. To begin, the processor 200 can select N of the M battery cells 220 (N being an integer less than M). The N battery cells can also be referred to as a subset of the M battery cells 220. The N battery cells can include weakest battery cells of the M battery cells 220. The term "weakest" as used herein can refer to N of the M battery cells 220 having (i) lowest voltages under discharge current or (ii) highest voltages under charge current.

In some implementations, the N battery cells can be divided into two distinct groups. These two distinct groups can also be referred to as a high cell window (HCW) of the battery cells 220 and a low cell window (LCW) of the battery cells 220. The LCW can include any of the M battery cells 220 having lowest voltages among all N of the battery cells 220 during discharge. Similarly, the HCW can include any of the M battery cells 220 having highest voltages during charge. The total number of battery cells 220 in the LCW and the HCW can equal N. For example, the LCW and the HCW can include N1 and N2 of the battery cells 220, respectively, where N1 and N2 are integers greater than zero and N1+N2=N. For example only, N1 and N2 could both equal N/2. It should be appreciated, however, that the LCW and the HCW can each include different numbers of the battery cells 220.

These N weakest cells should be monitored because their parameters can have a larger impact on the parameters for the battery pack 128 as a whole under charge or discharge. The value of N can be predetermined or can be determined based on a predetermined percentage of M (a total number of battery cells 220 in the battery pack 128). For example, the value of N can be 10. Alternatively, for example, the value of N can be determined based on 10% of M. For example only, if M=96, N can be determined based on 10% of 96 (9.6), which can be rounded to obtain N=10. After the value of N is determined, the processor 200 can identify the N battery cells from the M battery cells 220. Because operating parameters of the individual battery cells 220 may change during operation of the EV 100, the processor 200 can dynamically identify the N battery cells from the M battery cells 220, e.g., periodically, during operation of the EV 100. For example, the N weakest battery cells can be N of the M battery cells 220 that have measured voltages that are highest or lowest among all cell voltages at the time of measuring.

After identifying the N battery cells, the processor 200 can monitor the N battery cells. Monitoring the N battery cells can include measuring, or determining via measurements, one or more first parameters for each of the N battery cells. The one or more first parameters can be any suitable parameters for a specific battery cell 220 (resistances, capacitances, open circuit voltages, etc.). It should be appreciated that other parameters can also be measured or determined based on measurements. The processor 200 can determine the one or more first parameters for each of the N battery cells based on measurements from the sensors 204. As previously mentioned, the sensors 204 can include any suitable sensors for obtaining the one or more first parameters, such as current sensors, voltage sensors, temperature sensors and the like. In some implementations, current and/or voltage measurements can be taken for each of the N battery cells at varying temperatures for each of the cells, which can result in a matrix of data having specific current/voltage measurements at various different temperatures.

Figure 3:
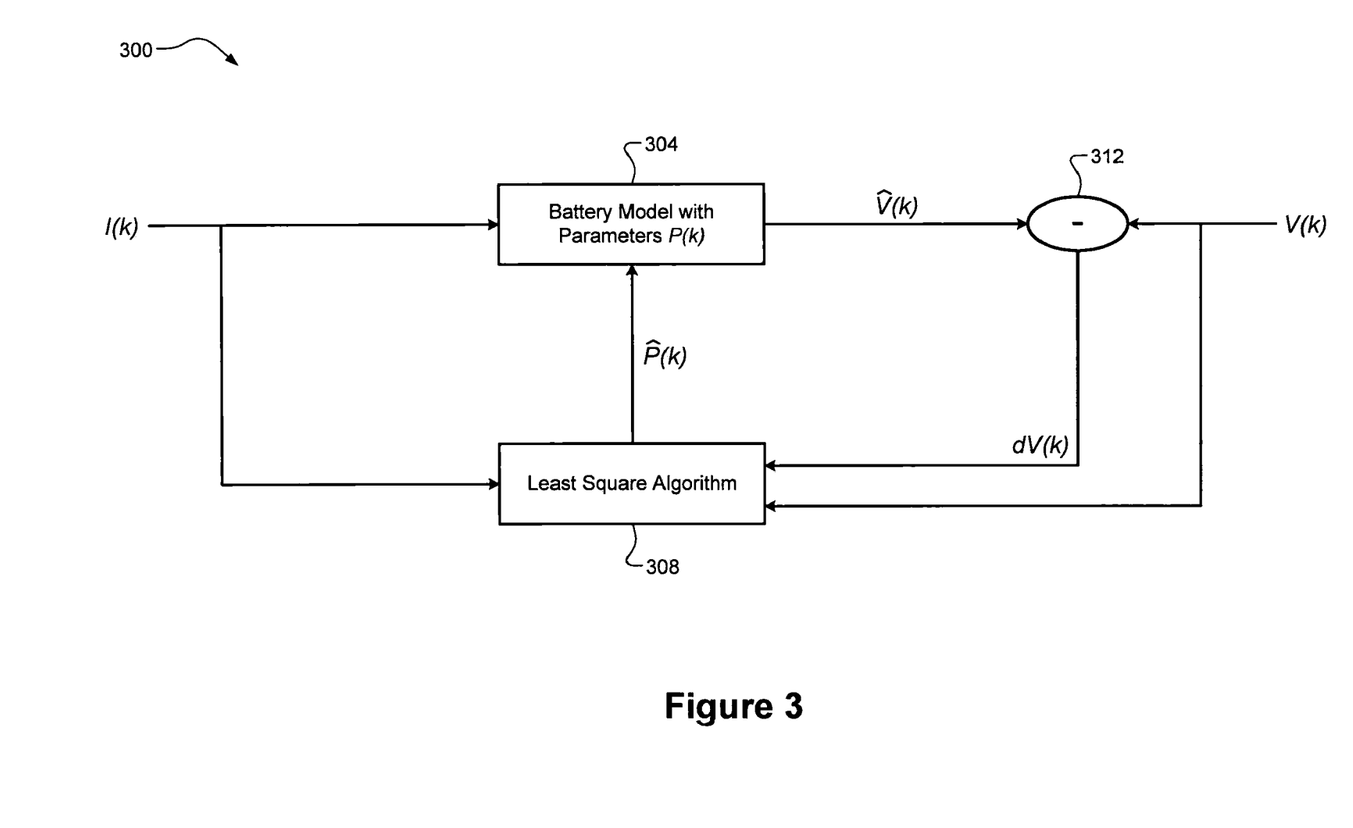
FIG. 3 is a diagram of a recursive least square (RLS) algorithm utilized by the BPC according to the principles of the present disclosure.

After determining the one or more parameters for each of the N battery cells, the processor 200 can estimate one or more second parameters (also referred to as a set of second parameters) for the battery pack 128 based on the one or more first parameters for each of the N battery cells. The one or more second parameters can be any suitable parameters for the battery pack 208 as a whole (SOC, SOP, SOH, etc.). The one or more second parameters for the battery pack 128 represent an estimation because the processor 200 is using the subset N of the M battery cells 208 to estimate the one or more second parameters. The processor 200 can estimate the one or more second parameters for the battery pack 128 by utilizing a recursive least square (RLS) algorithm, which is illustrated in FIG. 3 and described in detail below. In some implementations, the RLS algorithm can be an online RLS algorithm that processes the one or more parameters for each of the N battery cells in a piece-by-piece or a serial manner. It should be appreciated that other suitable estimation algorithms can be used.

After estimating the one or more second parameters for the battery pack 128, the processor 200 can output the one or more second parameters. In some implementations, the processor 200 can store the one or more second parameters at the memory 208. In other implementations, the processor 200 can send the one or more second parameters to the communication device 212, which can transmit the one or more second parameters to the vehicle controller 104. The vehicle controller 104 can adjust operation of the EV 100 based on the one or more second parameters. In some implementations, the vehicle controller 104 can receive the SOP of the battery pack 128 from the BPC 132, and the vehicle controller 104 can then selectively regulate a driver torque request from the driver input device 112 based on the SOP of the battery pack 128. In such cases, the driver torque request may exceed a maximum torque output of the electric motor due to a limited SOP of the battery pack 128. For example, this can include the vehicle controller 104 limiting the driver torque request so the battery pack 128 is able to provide the electric motor 124 with the requested amount of current.

In other implementations, the vehicle controller 104 can receive the SOC of the battery pack 128 from the BPC 132 and can selectively display information regarding at least one of the SOC and a range of the EV 100. For example, this information can be displayed via an instrument panel of the EV 100, via a center console display of the EV 100, or via another suitable display device of the EV 100. The SOC can be displayed as a percentage of charge, e.g., 30% charge remaining, and the electric drive range of the EV 100 can be displayed as a distance, e.g., 80 miles remaining. It should be appreciated that other information can also be displayed, such as warnings based on the SOH of the battery pack 128.

Referring now to FIG. 3, a schematic diagram of an RLS algorithm 300 utilized by the BPC 132 is illustrated. The RLS algorithm 300 can represent a recursive process to update estimated parameters P̂(k) to minimize error between an actual output V(k) and a model-based predicted output V̂(k). The RLS algorithm 300 can include a battery model 304 for parameters P(k), a least square (LS) algorithm 308, and a subtraction operator 312. The inputs to the RLS algorithm 300 can include a current I(k) at a specific battery cell and a voltage V(k) at the specific battery cell. The index k can indicate a time step at which the RLS algorithm 300 is periodically executed by the BPC 132. For example only, the time step k may be a few hundred milliseconds (ms). The current I(k) and the voltage V(k) at the specific battery cell can be measured using the sensors 204.

The LS algorithm 308 can calculate the estimated parameters P̂(k) based on the measured current I(k), the measured voltage V(k), and a voltage differential dV(k). The LS algorithm 308 can be any suitable LS algorithm configured to minimize the sum of the squares of the estimation error of the RLS algorithm 300. The subtraction operator 312 can calculate the voltage differential dV(k) between the measured voltage V(k) and the predicted output V̂(k). The battery model 304 can calculate the predicted output V̂(k) based on the measured current I(k) and the estimated parameters P̂(k). It should be appreciated that the configuration of the RLS algorithm illustrated in FIG. 3 is merely an example and other suitable configurations of the RLS algorithm 300 can also be implemented.

The RLS algorithm 300 can begin with an initialization procedure. The initialization procedure can include measuring initial values I(0) and V(0) and setting initial values for P(k) to estimation results from a previous operation. For example, these estimation results may have been obtained during the previous operation and stored at the memory 208, and thus may be retrieved from the memory 208. The RLS algorithm 300 can then receive measured data I(k) and V(k). The RLS algorithm 300 can then calculate X(k) from the measured data I(k), V(k) and previous measurements I(k−1), V(k−1), I(k−2), V(k−2), etc. X(k) can represent an observation matrix comprising measured currents I(k) and voltages V(k) at various time steps k, which can be used along with the estimated parameters P(k) by the battery model 304 in order to calculate the predicted output V̂(k).

The RLS algorithm 300 can then calculate a gain vector G based on the parameters P(k) and the observation matrix X(k). In some implementations, the RLS algorithm 300 can calculate the gain vector G as follows:

$$G = \frac{PX(k)}{\lambda + X^T(k)PX(k)}$$

where λ represents a forgetting factor and $X^T(k)$ represents a transform of the observation matrix X(k). For example, λ may be preselected from a range 0<λ≤1. The RLS algorithm 300 can then compute an estimation error e. In some implementations, the RLS algorithm 300 can calculate the estimation error e as follows:

$$e = V(k) - V(k-1) - P^T X(k)$$

where $P^T(k)$ represents a transform of the parameters P(k).

The RLS algorithm 300 can then adapt the parameters P(k) to minimize the estimation error e. In some implementations, the RLS algorithm 300 can adapt the parameters P(k) to minimize the estimation error e as follows:

$$P_{new} = P + Ge.$$

where $P_{new}$ represents the adapted parameters P(k). The RLS algorithm 300 can then calculate the one or more first parameters (resistances, capacitances, open circuit voltages, etc.) and can update a correlation matrix $P_{update}$ for future data points. In some implementations, the RLS algorithm 300 can update the correlation matrix P as follows:

$$P_{update} = \frac{1}{\lambda} P - \frac{1}{\lambda} G X^T(k) P,$$
$$P = P_{update},$$

where $P_{update}$ represents the updated correlation matrix.

Lastly, the RLS algorithm 300 can determine whether a current operation has ended. The RLS algorithm 300 may determine that the current operation has ended based on a variety of different criteria. For example, the RLS algorithm 300 may determine that the current operation has ended when the voltage differential dV(k) (the difference between the measured voltage V(k) and the predicted output V̂(k)) is less than a predetermined voltage. For example only, the predetermined voltage may be a few hundred millivolts (mV). It should be appreciated, however, that other criteria may be used to determine whether the current operation has ended. The RLS algorithm 300 can then repeat for one or more additional cycles according to the time step k.

Figure 4:
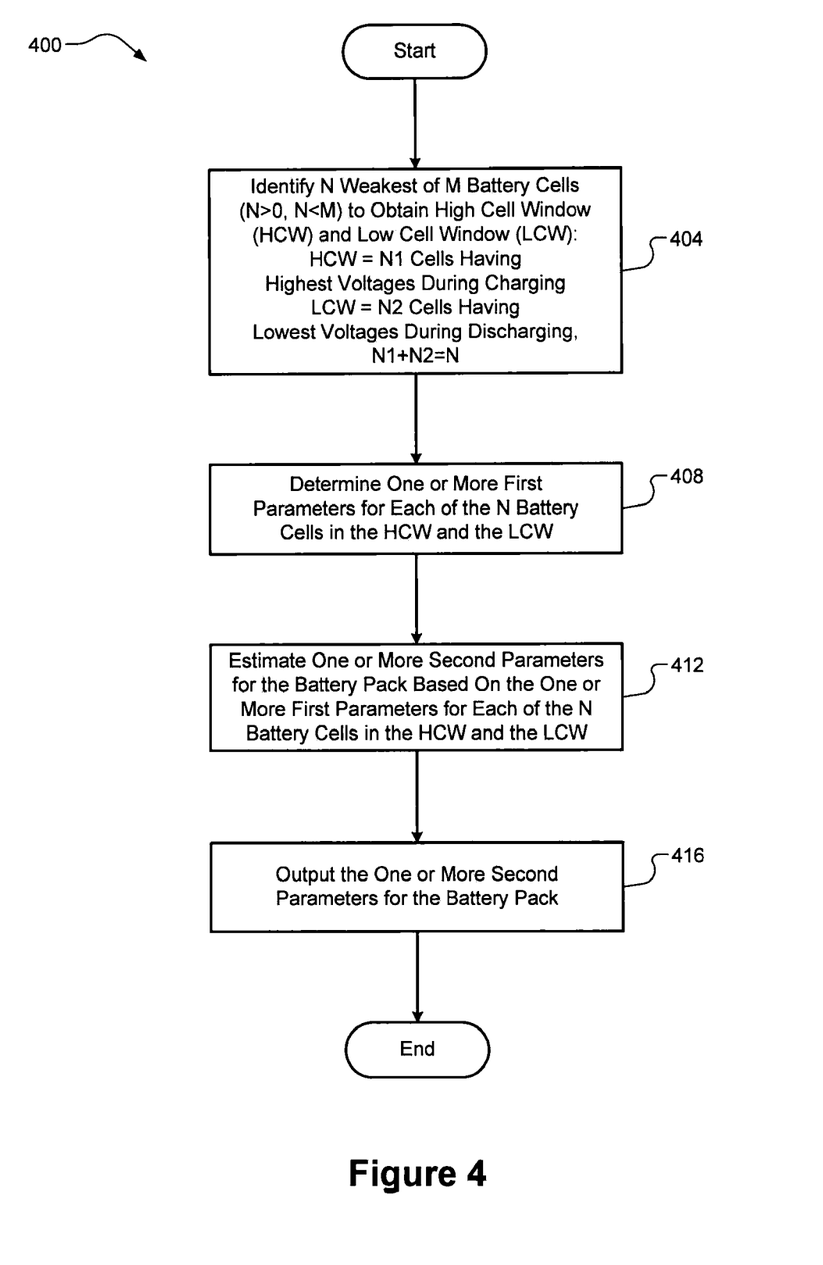
FIG. 4 is a flow diagram of a method for techniques for estimating battery pack parameters including power limit prediction of a battery pack according to the principles of the present disclosure.

Referring now to FIG. 4, a flow diagram of a method 400 for multi-cell battery pack power limit prediction is illustrated. At 404, the BPC 132 can identify N of the battery cells 220 of a battery pack 128 to obtain N battery cells. The N battery cells can be weakest battery cells of the battery pack 128 in the HCW and the LCW based on measured battery cell voltages under charge and discharge, respectively. N can be an integer greater than zero and less than M, where M is a total number of the battery cells 220 in the battery pack 128. At 408, the BPC 132 can determine one or more first parameters for each of the N battery cells, each of the one or more first parameters indicating a parameter for a specific battery cell 220 (resistances, capacitances, open circuit voltages, etc.).

At 412, the BPC 132 can estimate one or more second parameters for the battery pack 128 based on the one or more first parameters for each of the N battery cells in the HCW and the LCW, each of the one or more second parameters indicating a parameter for the battery pack 128 (SOC, SOP, SOH, etc.). For example only, the SOC of the battery pack 128 may be determined as the smallest SOC of the N weakest battery cells 220, the SOP of the battery pack 128 may be determined as the lowest SOP of the N weakest battery cells 220, and/or the SOH of the battery pack 128 may be determined as either the lowest capacity or highest impedance of the N weakest battery cells 220. At 416, the BPC 132 can output the one or more second parameters for the battery pack 128 based on the estimation of the weakest N cells from the HCW and the LCW during charging and discharging, respectively. For example, the BPC 132 can output the one or more second parameters for the battery pack 128 to the memory 208 for storage and/or to the vehicle controller 104 (via the communication device 212), which can adjust operation of the EV 100 appropriately. For example, the SOP can cause the vehicle controller 104 to selectively regulate a driver torque request to an electric motor of the electric vehicle, which can protect the battery pack from damage. The method 400 can then end or return to 404 for one or more additional cycles.

It should be understood that the mixing and matching of features, elements, methodologies and/or functions between various examples may be expressly contemplated herein so that one skilled in the art would appreciate from the present teachings that features, elements and/or functions of one example may be incorporated into another example as appropriate, unless described otherwise above.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

What is claimed is:

1. A method, comprising:
    identifying, at a battery pack controller of an electrified vehicle, the battery pack controller including one or more processors, N weakest battery cells of a battery pack that includes M battery cells, the identifying including:
        determining an integer value for N that is greater than one and less than an integer value of M;
        dynamically identifying the N weakest battery cells having at least one of (i) lowest voltages during discharging and (ii) highest voltages during charging; and
        dynamically identifying a high cell window (HCW) that contains N1 highest voltage battery cells during charging (LCW) that contains N2 lowest voltage battery cells during discharging, wherein N1 and N2 are each integer values greater than zero and a sum of N1 and N2 equals N;
    determining, at the battery pack controller, one or more first parameters for only each of the N weakest battery cells, each of the one or more first parameters indicating a parameter for a specific battery cell;
    estimating, at the battery pack controller, one or more second parameters for the battery pack based on the one or more first parameters for only each of the N weakest battery cells, each of the one or more second parameters indicating a parameter for the battery pack;
    outputting, from the battery pack controller and to a vehicle controller of the electrified vehicle, the one or more second parameters for the battery pack; and
    selectively regulating, by the vehicle controller, a driver torque request for an electric motor of the electrified vehicle based on the one or more second parameters for the battery pack.

2. The method of claim 1, further comprising measuring, at the battery pack controller, voltages at each of the M battery cells to obtain M voltages, wherein the N weakest battery cells are dynamically identified from the M battery cells based on the M voltages.

3. The method of claim 1, wherein the value of N is predetermined or is determined based on a predetermined percentage of M.

4. The method of claim 3, wherein N equals 10 or is based on 10% of M.

5. The method of claim 1, wherein the one or more first parameters include at least one of resistances, capacitances, and open circuit voltages for a specific battery cell.

6. The method of claim 5, further comprising measuring, at the battery pack controller, at least one of voltages and currents at each of the N weakest battery cells, wherein the one or more parameters for the N weakest battery cells are determined based on the measuring of at least one of the voltages and the currents.

7. The method of claim 6, further comprising measuring, at the battery pack controller, temperatures at the N weakest battery cells, wherein the one or more parameters for the N weakest battery cells are determined further based on the measuring of the temperatures.

8. The method of claim 1, wherein the one or more second parameters include at least one of a state of charge (SOC), a state of power (SOP), and a state of health (SOH) of the battery pack.

9. The method of claim 8, wherein the SOP causes the vehicle controller to selectively regulate the driver torque request for the electric motor of the electrified vehicle.

10. The method of claim 8, wherein the SOC causes the vehicle controller to selectively display information regarding at least one of the SOC and a range of the electrified vehicle at a display of the electrified vehicle.

11. The method of claim 1, wherein estimating the one or more second parameters includes utilizing, at the battery pack controller, a recursive least square (RLS) algorithm to estimate the one or more second parameters based on the one or more first parameters.

12. The method of claim 11, wherein the one or more second parameters are output to and stored at a memory as a previous one or more second parameters, and wherein estimating the one or more second parameters includes retrieving the previous one or more second parameters from the memory and using the previous one or more second parameters in the RLS algorithm to estimate the one or more second parameters.

13. A method, comprising:
    measuring, at a battery pack controller of an electrified vehicle, the battery pack controller including one or more processors, a voltage at each battery cell of a battery pack comprising M cells to obtain M voltages;
    identifying, at the battery pack controller, a first subset of battery cells based on the M voltages, wherein the first subset of battery cells represents a low cell window (LCW) and includes a weakest N1 of the M battery cells having lowest voltages during discharging;
    identifying, at the battery pack controller, a second subset of battery cells based on the M voltages, wherein the second subset of battery cells represents a high cell window (HCW) and includes a weakest N2 of the M battery cells having highest voltages during charging, wherein N1 and N2 are integers greater than zero and that sum to N, and wherein N is an integer greater than one and less than an integer value of M;
    determining, at the battery pack controller, a set of first parameters for only each of the N battery cells in the LCW and the HCW, the set of first parameters including current and voltage at the specific battery cell;
    estimating, at the battery pack controller, a set of second parameters for the battery pack based on the set of first parameters for only each of the N battery cells in the LCW and the HCW using an online recursive least square (RLS) algorithm, the set of second parameters including at least one of a state of power (SOP), a state of charge (SOC), and a state of health (SOH) for the battery pack;

outputting, from the battery pack controller and to a vehicle controller of the electrified vehicle, the set of second parameters for the battery pack; and selectively regulating, by the vehicle controller, a driver torque request for an electric motor of the electrified vehicle based on the set of second parameters.

14. The method of claim 13, wherein the SOP for the battery pack is determined as a lowest SOP of the N weakest battery cells in the LCW and the HCW, wherein the SOC for the battery pack is determined as a lowest SOC of the N weakest battery cells in the LCW and the HCW, and wherein the SOH of the battery pack is determined as either a lowest capacity or a highest impedance of the N weakest battery cells in the LCW and the HCW.

15. The method of claim 13, wherein the SOP causes the vehicle controller to selectively regulate the driver torque request for the electric motor of the electrified vehicle, and wherein the SOC causes the vehicle controller to selectively display information regarding at least one of the SOC and a range of the electrified vehicle at a display of the electrified vehicle.

16. The method of claim 13, wherein the set of second parameters are output to and stored at a memory as a previous set of second parameters, and wherein estimating the one or more second parameters utilizing the RLS algorithm includes retrieving the previous set of second parameters from the memory and using the previous set of second parameters in the RLS algorithm to estimate the set of second parameters.

17. A battery management system for an electrified vehicle, the system comprising:

one or more sensors configured to measure a voltage of M battery cells of a battery pack, the battery pack being configured to supply a current to an electric motor of the electrified vehicle; and one or more controllers configured to:
 receive the M measured voltages;
 based on the M measured voltages, identify N weakest battery cells, the identifying including:
  determining a value for N, wherein N is an integer greater than one and less than an integer value of M;
  dynamically identifying the N weakest battery cells having at least one of (i) the lowest measured voltages under a discharge current and (ii) the highest measured voltages under a charge current; and
  dynamically identifying a high cell window (HCW) that contains N1 highest voltage battery cells under a discharge current and a low cell window (LCW) that contains N2 lowest voltage battery cells under a charge current wherein N1 and N2 are each integer values greater than zero and a sum of N1 and N2 equals N;
 determine first parameters the N weakest battery cells and not for a remainder of the M cells;
 based on the first parameters, estimate second parameters for the battery pack; and
 based on the second parameters, control the electric motor.

* * * * *